(12) United States Patent
Lahiri et al.

(10) Patent No.: US 7,015,132 B2
(45) Date of Patent: Mar. 21, 2006

(54) FORMING AN ELECTRICAL CONTACT ON AN ELECTRONIC COMPONENT

(75) Inventors: Syamal Kumar Lahiri, Milpitas, CA (US); Rinus Tek Po Lee, Singapore (SG); Zuruzi Bin Abu Samah, Santa Barbara, CA (US)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/038,291

(22) Filed: Jan. 2, 2002

(65) Prior Publication Data

US 2002/0102765 A1   Aug. 1, 2002

(30) Foreign Application Priority Data

Jan. 4, 2001  (SG)  ................................ 200100049

(51) Int. Cl.
   *H01L 21/44*  (2006.01)
(52) U.S. Cl. ........................................ 438/614; 438/615
(58) Field of Classification Search ................ 438/603, 438/615; 228/180.22, 253
   See application file for complete search history.

(56) References Cited

U.S. PATENT DOCUMENTS

| 5,071,787 | A | * | 12/1991 | Mori et al. | 29/840 |
| 5,895,231 | A | * | 4/1999 | Choi et al. | 438/106 |
| 5,908,317 | A | * | 6/1999 | Heo | 438/617 |
| 6,043,985 | A | * | 3/2000 | Azdasht et al. | 361/707 |
| 6,337,445 | B1 | * | 1/2002 | Abbott et al. | 174/260 |
| 6,372,622 | B1 | * | 4/2002 | Tan et al. | 438/612 |
| 6,395,983 | B1 | * | 5/2002 | Gutierrez | 174/52.4 |
| 6,440,835 | B1 | * | 8/2002 | Lin | 438/611 |
| 6,454,159 | B1 | * | 9/2002 | Takushima | 228/253 |

FOREIGN PATENT DOCUMENTS

WO    WO96/16442 A1    5/1996

* cited by examiner

*Primary Examiner*—Stephen W. Smoot
(74) *Attorney, Agent, or Firm*—Workman Nydegger

(57) ABSTRACT

A method of constructing an electrical contact on an electronic component comprises first forming a protruding electrically conducting stud at a contact location by wire bonding a metal wire to a contact pad of the component. The stud is then contacted with solder, without using a mask, so that a solder bump is deposited on and adheres to the metal stud to form a composite solder contact which is able to form with a contact of another component a solder joint which has good electrical and mechanical properties and which may be reliable fabricated at high density by a low cost method. An electronic component provided with such solder contacts and an electronics component package including such a component are also disclosed.

35 Claims, 2 Drawing Sheets

6   3

6   3

FORMING AN ELECTRICAL CONTACT ON AN ELECTRONIC COMPONENT

RELATED APPLICATIONS

This application claims priority to Singapore Application serial No. 200100049-6, filed Jan. 4, 2001, which is hereby incorporated by reference in its entirety.

FIELD OF THE INVENTION

This invention relates to a method of forming an electrical contact on an electronic component, such as the semiconductor chip or substrate of an electronic component package, particularly for application in flip-chip technology.

BACKGROUND OF THE INVENTION

With the increasing density of devices on a semiconductor chip and ever more complex applications there is a need to form ever smaller and more precise electrical connections when packaging such semiconductor chips, especially medium and higher end products with high input/output counts.

In one conventional method, electrical connections in packaged electronic components are made using electrical contacts in the form of solder bumps which are deposited by a solder deposition process on contact pads of one of two components to be interconnected, the solder deposition process requiring special alignment techniques, such as the application of a masking resist to the surface of the component to define the individual locations at which solder bumps are to be deposited. The masking layer then has to be subsequently removed after the solder has been deposited on the surface.

In another known method, solder paste is screen printed on the contact pads of a component using a metal mask. The use of such metal masks means that accurate alignment techniques are required to deposit the paste on individual pads and that the chance of bridging between pads increases as the pitch decreases.

In yet another known process for making electrical connections, a contact on one component is connected to a metal stud on another components using an electrically conducting adhesive material which contains metal particles. Because only a few of the metal particles in the adhesive material make an electrical connection with the stud, the electrical resistance of such an connection is rather high.

With the ever smaller size, higher packing density and complexity of semiconductor devices in semiconductor chips, the electronic component packaging industry is increasingly being faced with the need to provide more closely packed electrical connections of smaller and smaller area whilst maintaining the electrical isolation and integrity of the individual connections.

Because the required dimensions of solder joints are therefore steadily shrinking and solders have an intrinsically low melting point, the electrical resistance, the mechanical strength and the susceptibility of such joints to electromigration are becoming increasingly important factors.

It is becoming increasingly troublesome to form satisfactory connections of the required small size and at the required small pitch using these known connection-forming techniques. For example, it is extremely difficult and relatively expensive to form solder bumps by conventional methods with a bump size of 75 $\mu$m or less at a pitch of 125 $\mu$m or less.

SUMMARY OF THE INVENTION

It is an object of the present invention to provide a method of forming an electrical contact on an electronic component which enables strong, low resistance connections of high integrity to be reliably constructed with a size of 100 $\mu$m or less and a pitch of 150 $\mu$m or less.

Accordingly, in one aspect, the invention provides a method of constructing an electrical contact on an electronic component, comprising providing a protruding electrically conducting core on the component at a site where an electrical connection is to be made, and placing the core in contact with molten solder, without using a mask, to form on the stud a solder bump which adheres to the stud.

In another aspect, the invention provides a method of electrically interconnecting two electronic components, comprising forming an electrical contact on a contact pad of one of the components using the method of the invention and forming a bond between the electrical contact thus formed and a contact pad of the other component.

In a further aspect, the invention provides an electronic component having an electrical contact which is formed by a protruding electrically conducting core and a solder bump formed on and adhering to the core.

In yet another aspect, the invention provides an electronic components package comprising a semiconductor chip and a mounting substrate, in which one of the chip and the substrate is a component having electrical contacts formed in accordance with the invention, and the other of the chip and substrate has contact pads bonded to the electrical contacts of the one component by the solder bumps of the contacts.

BRIEF DESCRIPTION OF THE DRAWINGS

In order that the invention may be more readily understood, an embodiment thereof will now be described, by way of example, with reference to the accompanying illustrations, in which.

DESCRIPTION OF THE PREFERRED EMBODIMENTS

Figure 1:
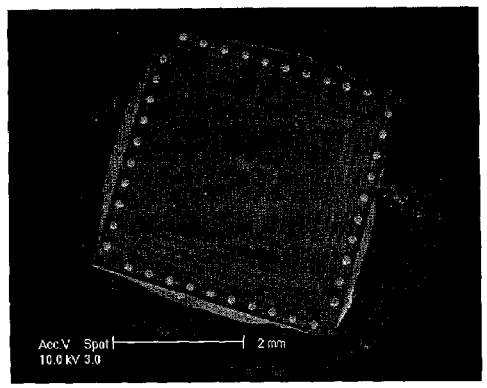
FIG. 1 is a plan view of an electronic component embodying the present invention in the form of a semiconductor test chip having electrical contacts formed by a method embodying the invention.

In one embodiment of the method of the present invention, protruding electrically conducting cores in the form of solid metal studs 1 (see FIGS. 4, 5 and 6) are fabricated on contact pads 2 of a semiconductor chip 3 which is to be electrically interconnected with a mounting substrate, which may be an organic substrate, in the manufacture of a packaged electronics product. The contact pads 2 are commonly made of aluminium or copper and may possibly be coated with other materials. The studs 1 are formed from gold wire of 25.4 $\mu$m diameter secured to the contact pads by means of a conventional wire bonding technique. The studs may be coined after they have been formed on the chip or may be left plain. Although the stud configurations shown in the drawings are linear arrays, both linear and two-dimensional stud arrays may be fabricated.

The projecting gold studs 1 thus formed on the contact pads 2 are then brought into contact with molten solder, for example by dipping in a solder bath, whereupon it is found that the solder selectively wets and adheres only to the studs and not to the other areas of the semiconductor chip 3. This selective wetting of the metal studs by the solder effectively self-alignes the solder deposits without the need for any additional alignment steps, such as the application and development of photo-resists or application of some other kind of mask, e.g. a metal mask.

FIGS. 1 to 5 show the electrical contacts 5 which are formed after dipping in molten solder and which comprise solder bumps 4 deposited on and adhering to the gold studs 1 fabricated on the aluminium pads 2 of the semiconductor test chip 3. As will be seen from the Figures, the solder only wets and adheres to the gold studs 1, leaving the aluminium pads 2 and the passivation surface 6 of the semiconductor chip 3 free of solder.

Figure 2:
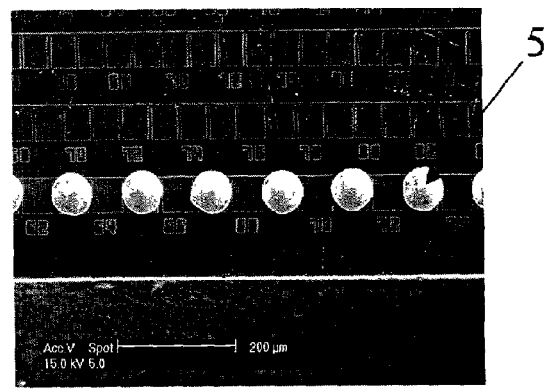
FIG. 2 is a plan view of the surface of the electronic component on an enlarged scale, showing the fine pitch which can be achieved by the method embodying the invention between adjacent electrical contacts in a row of such contacts.
Figure 3:
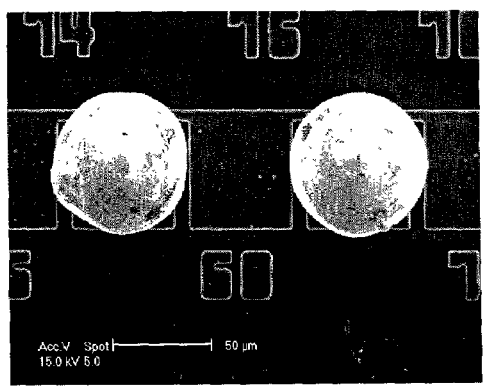
FIG. 3 is on a still larger scale and shows the integrity and good electrical isolation which can be achieved between adjacent electrical contacts formed in accordance with the method embodying the invention.

FIGS. 2 and 3 show that electrical contacts 5 formed in accordance with a method embodying the invention may be fabricated in close proximity to one another whilst still maintaining their structural and electrical integrity. In particular, FIGS. 2 and 3 show that contacts 5 having solder bumps 4 with a dimension of 75 $\mu$m can be fabricated without any solder bridging between the solder bumps, this bump dimension being comparable to or better than those achievable by the known processes currently used by the electronic component packaging industry.

Figure 4:
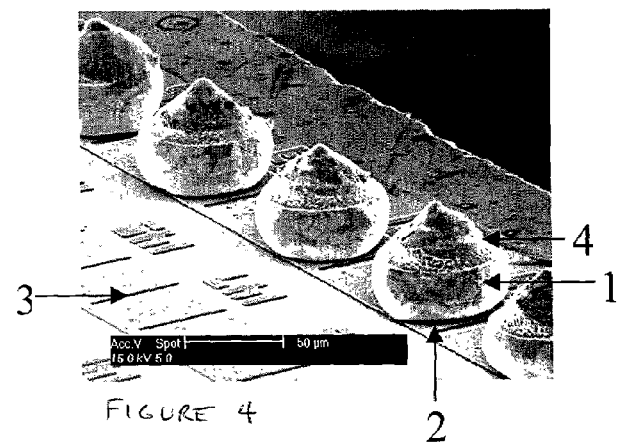
FIG. 4 is a view from above of a row of electrical contacts formed by the method embodying the present invention.

FIG. 4 shows that solder can be selectively deposited with good accuracy on the top part of the gold stud 1.

Figure 5:
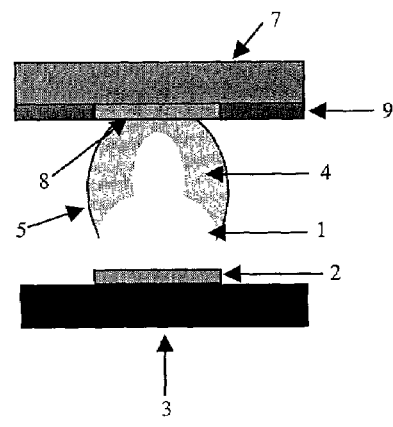
FIG. 5 is a schematic representation of a solder bond formed between a substrate and a semiconductor chip using an electrical contact provided on the chip by the method embodying the present invention.

After forming contacts 5 on a test chip 3 as described above, the chip was assembled with a substrate 7 (see FIG. 5). To this end, input/output pads 8 provided on the substrate 7 are masked with a solder mask 9 and joined to the solder bumps 4 of the electrical contacts 5 of the chip 3 to form solder joints which electrically interconnect the pads 2 and 8 of the chip 3 and substrate 7 as desired. In the resulting assembly, the solder bumps 4 of the chip contacts 5 formed a robust metallic bond with the input/output pads 8 of the substrate 7.

To test the reliability of the interconnections, the electrical contacts 5 were subjected to a microscopy study and shear tests were conducted on the electrical contacts using an ASTM (American Society for Testing Materials) standard method.

Figure 7:
FIGS. 7 and 8 illustrate the results of shear testing an electrical contact of an electronic component provided with such contact by the method embodying the invention.
Figure 8:
Figure 6:
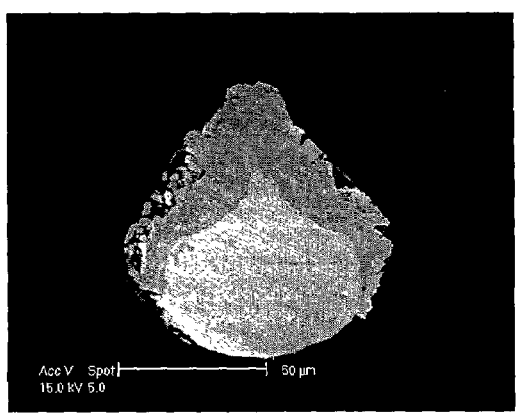
FIG. 6 is a cross-section taken through an electrical contact formed by the method embodying the invention.

FIG. 5 shows a schematic cross-section through the electrical contacts 5 formed on the chip 3 by the studs 1 with the solder bumps 4 adhering thereto. The shear tests revealed that the contacts had shear strengths well above the minimum acceptable value. Moreover, as illustrated in FIGS. 6 and 7, the shear tests applied to the contacts 5 resulted in fractures 6 occurring at the interface between the chip pads 2 and the silicon of the semiconductor chip 3, suggesting the existence of a very robust interface between the electrical contacts 5 and the pads 2 as well as strength within the contacts 5 themselves.

Whilst in the above described embodiment the electrical contacts are formed on a semiconductor chip they could, of course equally be formed on the substrate or on some other electronic component with which a solder joint is to be formed.

Although the studs in the described embodiment are made of gold, this is but one example of an electrically conducting material which can be used to form the solid core of a solder contact embodying the invention. In particular, wires of copper, silver, platinum, palladium or nickel or their alloys may be used to construct the electrically conducting studs on which the solder bumps are deposited to form the electrical contacts. Furthermore, it is envisaged that wires made of any other suitable material coated with gold, copper, silver, platinum, palladium or nickel or their alloys could be used to construct the electrically conducting studs. Moreover, it is envisaged that a plurality of studs may be stacked by wire bonding to increase the height of the resulting solder joint.

The formation of the solder bumps on the electrically conducting studs may be performed using any suitable process, such as dipping in a solder bath as described above or, for example, by wave soldering. If desired or necessary in any particular case, the studs may also be contacted with the solder a plurality of times in order to build the solder bump up to a required size.

It will be appreciated that electrical contacts embodying the present invention can be fabricated at relatively low cost using only equipment which is already standard in the electronic component packaging industry. In addition, the solder bumps are deposited on the studs by a self-aligning process which obviates the need to use masks to define the locations of the solder deposits, so that the method of fabricating the contacts is in fact simpler in this respect than existing methods.

The use of contacts embodying the invention enables the formation of high strength bonds during assembly, even with electrical contacts having a dimension of 75 $\mu$m or less, due to the combined effects of the mechanical support provided by the solid stud itself and a measure of solute alloying of the stud material which occurs when the molten solder is deposited on the stud. The solute alloying of the stud material into the solder of the solder bump also enhances the resistance of the contact to electromigration, a potentially serious problem as the size of solder joints decreases.

The high strength and the integrity of contacts embodying the invention significantly reduce the chances of the contacts collapsing during assembly, one of the main factors in reducing yields in the electronic component packaging industry. Moreover, the method by which such contacts are formed means that solder bumps having dimensions of 75 $\mu$m or less can be reliably produced at a pitch of 150 $\mu$m or less, thereby allowing the input/output counts of packaged semiconductor chips to be increased.

It is envisaged that, where the component on which the electrical contacts are to be formed is a chip, it may be advantageous to form the studs on chip before a semiconductor wafer incorporating the chip is diced to separate the individual chips contained in the wafer.

In the present specification "comprise" means "includes or consists of" and "comprising" means "including or consisting of".

The features disclosed in the foregoing description, or the following claims, or the accompanying drawings, expressed in their specific forms or in terms of a means for performing the disclosed function, or a method or process for attaining the disclosed result, as appropriate, may, separately, or in any combination of such features, be utilised for realising the invention in diverse forms thereof.

What is claimed is:

1. A method of constructing an electrical contact on a first electrical component, comprising the steps of:

on an electronic chip including an interconnection surface, the interconnection surface including a plurality of exposed contact pads and a non-wetting surface between the contact pads, fabricating on each of a portion of or all of the contact pads a protruding electrically conducting core having a solder wettable surface; and bringing the entire interconnection surface in contact with molten solder, wherein the solder selectively wets and adheres to the cores but not to the non-wetting surface, thereby depositing solder on all of the cores to form solder bumps thereon and leaving a substantial absence of solder between cores.

2. A method according to claim 1, wherein the electrically conducting core includes a metal stud.

3. A method according to claim 2, wherein said fabricating a protruding electrically conducting core is performed by bonding a wire to a contact pad.

4. A method according to claim 3, wherein the protruding electrically conducting core is formed by a gold wire of about 25.4 $\mu$m diameter.

5. A method according to claim 2, further comprising the step of coining the metal studs after fabrication on the contact pads.

6. A method according to claim 2, further comprising the step of stacking a plurality of studs by wiring bonding.

7. A method according to claim 1, wherein the formed solder bumps have a dimension of 75 $\mu$m or less without any bridging in-between.

8. A method according to claim 1, wherein the step of bringing the entire interconnection surface in contact with molten solder is performed by dipping the interconnection surface into a bath of molten solder.

9. A method according to claim 1, wherein the step of bringing the entire interconnection surface in contact with molten solder is performed through a wave soldering process.

10. A method according to claim 1, wherein the contact pads are spaced at a pitch of about 150 $\mu$m or less.

11. A method according to claim 1, wherein the step of bringing the entire interconnection surface in contact with molten solder is performed on a plurality of electronic chips on the same wafer.

12. A method according to claim 11, further comprising the step of:

following the step of bringing the entire interconnection surface in contact with molten solder, dicing the wafer into individual chips.

13. A method according to claim 1, further comprising the step of repeating the contact of the interconnection surface with molten solder to increase the size of the solder bumps.

14. A method of electrically connecting the produced chip of claim 1 to a second electronic component, the second electronic component having corresponding solderable contacts positioned to mate with the contacts of the first electrical component, the method further comprising the steps of:

mating the first and second electronic components such that the corresponding contacts of both the first and second electronic components are brought into proximal alignment; and applying heat to make an electrical connection between the corresponding contacts of the first and second electronic components using the solder of the solder bumps of the first electronic component.

15. A method according to claim 1, wherein the electrically conducting core is formed from a material selected from the group consisting of gold, copper, silver, platinum, palladium and nickel and their alloys.

16. A method according to claim 1, wherein the electrically conducting core is coated with a material selected from the group consisting of gold, copper, silver, platinum, palladium and nickel and their alloys.

17. A method of constructing electrical contacts on a wafer whereon is fabricated a number of semiconductor chips, each chip having an interconnection surface on the same side of the wafer, each interconnection surface including a plurality of exposed contact pads and a non-wetting surface between the contact pads, the method comprising the steps of:

fabricating on each of a portion of or all of the contact pads a protruding metal stud having a solder wettable surface;

simultaneously bringing the entire interconnection surface of chips of the wafer in contact with molten solder, wherein the solder selectively wets and adheres to the studs but not to the non-wetting surface, thereby depositing solder on all of the studs to form solder bumps thereon and leaving a substantial absence of solder between the studs; and following the step of bringing the entire interconnection surface of the wafer in contact with molten solder, dicing the wafer into separate and individual chips.

18. A method according to claim 17, wherein said fabricating a protruding stud is performed by bonding a wire to the particular contact pad.

19. A method according to claim 18, wherein the protruding stud is formed by a gold wire of about 25.4 $\mu$m diameter.

20. A method according to claim 17, further comprising the step of coining the metal studs after fabrication on the contact pads.

21. A method according to claim 17, further comprising the step of stacking a plurality of studs by wire bonding.

22. A method according to claim 17, wherein the formed solder bumps have a dimension of 75 $\mu$m or less without any bridging in-between.

23. A method according to claim 17, wherein the step of bringing the entire interconnection surface in contact with molten solder is performed by dipping the interconnection surface into a bath of molten solder.

24. A method according to claim 17, wherein the step of bringing the entire interconnection surface in contact with molten solder is performed through a wave soldering process.

25. A method according to claim 17, wherein the contact pads are spaced at a pitch of about 150 $\mu$m or less.

26. A method according to claim 17, further comprising the step of repeating the contact of the interconnection surface with molten solder to increase the size of the solder bumps.

27. A method of electrically connecting the produced separated chip of claim 17 to a second electronic component, the second electronic component having corresponding solderable contacts positioned to mate with the contacts of the separated chip, the method further comprising the steps of:
mating the separated chip and second electronic component such that the corresponding contacts of both are brought into proximal alignment; and
applying heat to make an electrical connection between the contacts of the separated chip and second electronic component using the solder of the solder bumps of the separated chip.

28. A method according to claim 17, wherein the electrically conducting core is formed from a material selected from the group consisting of gold, copper, silver, platinum, palladium and nickel and their alloys.

29. A method according to claim 17, wherein the electrically conducting core is coated with a material selected from the group consisting of gold, copper, silver, platinum, palladium and nickel and their alloys.

30. A method of constructing electrical contacts on a wafer whereon is fabricated a number of semiconductor chips, each chip having an interconnection surface on the same side of the wafer, each interconnection surface including a plurality of exposed contact pads and a non-wetting surface between the contact pads, the contact pads being spaced at a pitch of about 150 $\mu$m or less, the method comprising the steps of:
fabricating on each of a portion of or all of the contact pads a protruding metal stud having a solder wettable surface by bonding a wire to the contact pads;
coining the metal studs;
simultaneously bringing the entire interconnection surface of chips of the wafer in contact with molten solder through a solder bath or wave solder process, wherein the solder selectively wets and adheres to the studs but not to the non-wetting surface, thereby depositing solder on all of the studs to form solder bumps having a dimension of 75 $\mu$m or less without any bridging in-between; and
following the step of bringing the entire interconnection surface of the wafer in contact with molten solder, dicing the wafer into separate and individual chips.

31. A method according to claim 30, wherein the protruding stud is formed by a gold wire of about 25.4 $\mu$m diameter.

32. A method according to claim 30, further comprising the step of stacking a plurality of studs by wire bonding.

33. A method according to claim 30, further comprising the step of repeating the contact of the interconnection surface with molten solder to increase the size of the solder bumps.

34. A method according to claim 30, wherein the electrically conducting core is formed from a material selected from the group consisting of gold, copper, silver, platinum, palladium and nickel and their alloys.

35. A method according to claim 30, wherein the electrically conducting core is coated with a material selected from the group consisting of gold, copper, silver, platinum, palladium and nickel and their alloys.

* * * * *

UNITED STATES PATENT AND TRADEMARK OFFICE
CERTIFICATE OF CORRECTION

| | | |
|---|---|---|
| PATENT NO. | : 7,015,132 B2 | |
| APPLICATION NO. | : 10/038291 | |
| DATED | : March 21, 2006 | |
| INVENTOR(S) | : Syamal Kumar Lahiri et al. | |

It is certified that error appears in the above-identified patent and that said Letters Patent is hereby corrected as shown below:

TITLE Page
Item 30, Foreign Application Priority Data, change "200100049" to --200100049-6--

Signed and Sealed this

Twenty-sixth Day of September, 2006

JON W. DUDAS
*Director of the United States Patent and Trademark Office*